United States Patent
Kong

(10) Patent No.: US 7,403,216 B2
(45) Date of Patent: Jul. 22, 2008

(54) FILM EXPOSURE METHOD AND APPARATUS USING LIQUID CRYSTAL DISPLAY

(75) Inventor: Nam Yong Kong, Seongnam-shi (KR)

(73) Assignee: LG. Display Co., Ltd., Seoul (KR)

( * ) Notice: Subject to any disclaimer, the term of this patent is extended or adjusted under 35 U.S.C. 154(b) by 305 days.

(21) Appl. No.: 10/953,433

(22) Filed: Sep. 28, 2004

(65) Prior Publication Data

US 2005/0140775 A1    Jun. 30, 2005

(30) Foreign Application Priority Data

Dec. 29, 2003    (KR) ...................... 10-2003-0098922

(51) Int. Cl.
    *B41J 2/47* (2006.01)
(52) U.S. Cl. ...................... 347/239; 347/255
(58) Field of Classification Search ......... 347/232–233, 347/237–240, 251–255, 247, 245, 257, 262–264; 358/302; 345/89; 348/207.2, 220.1, 373–376; 396/429; 340/166, 276.1; 349/4; 430/358
    See application file for complete search history.

(56) References Cited

U.S. PATENT DOCUMENTS 3,544,319 A * 12/1970 Diebold et al. ........... 430/276.1
4,052,217 A * 10/1977 Watkinson .................. 430/166
4,675,702 A * 6/1987 Gerber ....................... 347/233
4,935,820 A * 6/1990 Patel et al. .................. 358/302
5,796,421 A * 8/1998 Jyojiki ........................ 347/257
6,374,060 B1 * 4/2002 Mogamiya ................. 396/429
6,417,828 B1 * 7/2002 Sato et al. ..................... 345/89
6,963,359 B1 * 11/2005 Aosaki et al. ............. 348/207.2

FOREIGN PATENT DOCUMENTS

JP    11344941 A * 12/1999

\* cited by examiner

*Primary Examiner*—Hai C Pham
(74) *Attorney, Agent, or Firm*—Brinks Hofer Gilson & Lione

(57) ABSTRACT

A film exposure apparatus employs a liquid crystal display. The film exposure apparatus may reduce the film and plate fabrication cost and time required in a publication printing process and may also enhance printing quality. The apparatus may include an exposure device that illuminates the LCD. The LCD may display an image in one or more gray scales that may correspond to color concentrations in a document to be reproduced. The LCD may control the amount of light that passes through the LCD and that exposes red (R), green (G), and blue (B) films.

4 Claims, 9 Drawing Sheets

FILM EXPOSURE METHOD AND APPARATUS USING LIQUID CRYSTAL DISPLAY

PRIORITY CLAIM

This application claims the benefit of Korean Application No. P2003-098922, filed on Dec. 29, 2003, which is hereby incorporated by reference as if fully set forth herein.

BACKGROUND

1. Technical Field

The present invention relates to an apparatus for exposing films, and more particularly, to a printing film exposure method and apparatus using a liquid crystal display. Although the present invention is suitable for a wide scope of applications, it is particularly suitable for facilitating the exposure of a film used for printing documents.

2. Related Art

Printing technology, such as offset printing, helps meet the critical need in society to disseminate and preserve knowledge. FIG. 1 is a block diagram showing process steps of an offset printing method. FIG. 2 illustrates an example of a document that may be duplicated by offset printing.

Referring to FIG. 1, the offset printing method includes a drafting step 11S, wherein a document that is to be printed is photographed and drafted for printing; a planning step 12S, wherein the contents of the printed material that is to be produced is decided; and a correcting step 13S, wherein a corrected copy for reproduction is determined by deciding the overall color coordination of the original document based on the results of the planning step 12S. The offset printing method also includes a plate-making step 14S, wherein the plate that transfers the ink to an intermediate printing medium is fabricated; and a printing step 15S, wherein the copy is printed on a final medium using the plate and intermediate printing medium.

The plate-making step 14s will now be described in more detail. Basic colors such as red (R), yellow (Y), and blue (B), and their intensities, are combined to represent all of the colors in the original copy 20. During the plate-making step, the R, Y, and B color concentrations of the original copy 20 are expressed in the plates.

FIG. 2 illustrates the original copy 20 and labels the component colors R, Y, and B. FIGS. 3A to 3C illustrate plan views of a mask for each red color concentration with respect to the original copy 20. For example, as shown in FIG. 2, the original copy 20 is formed of three patterns of the color red (R), each representing a different concentration R1, R2, and R3; one pattern of the color yellow (Y) representing the concentration Y1; and two patterns of the color blue (B), each representing the two different concentrations B1 and B2. As examples, the concentration of R1 may be 10%, the concentration of R2 may be 20%, and the concentration of R3 may be 30%. The masks for each color concentration may be prepared by cutting a pattern into each mask that matches each of the R, Y, and B concentration patterns.

An exemplary process for fabricating masks from white paper for the color red (R) and its three concentrations R1, R2, and R3 will be described. A piece of white paper is selected and cut out along the pattern for R1, thereby forming a first mask M1, as shown in FIG. 3A. Subsequently, another piece of white paper is selected and cut out along the pattern for R2, to form a second mask M2, as shown in FIG. 3B. Finally, a third piece of white paper is selected and cut out along the pattern for R3, thereby forming a third mask M3. A mask for each of the concentrations for the colors yellow (Y) and blue (B), are also fabricated.

Thereafter, concentration plates are prepared for each concentration of the colors red (R), yellow (Y), and blue (B). The number of concentration plates required is equal to the number of the masks formed for the color concentrations. More specifically, the original copy 20 shown in FIG. 2 includes three patterns for the color red (R), one pattern for the color yellow (Y), and two patterns for the color blue (B). Therefore, six concentration plates are required. Each concentration plate corresponds to a color concentration in the original copy 20. Accordingly, the concentration plate corresponding to the first mask M1 has a concentration of 10%, the concentration plate corresponding to the second mask M2 has a concentration of 20%, and the concentration plate corresponding to the third mask M3 has a concentration of 30%. Similarly, the concentration plates corresponding to the masks of the colors of yellow (Y) and blue (B) have concentrations that correspond to the yellow concentration and the blue concentrations in the copy 20.

Subsequently, the prepared masks and concentration plates are used to expose R, Y, and B films to form patterns corresponding to the shapes defined on the masks at the intensities determined by the concentration plates. FIG. 4 illustrates exposing an offset printing film for the red color in the original copy 20. FIGS. 5A to 5C illustrate plan views of R, Y, and B films patterned for reproducing the R, Y, and B colors in the original copy 20.

The first mask M1 having the pattern for R1, the first concentration plate 22a having the R1 concentration of 10%, and the R film 23 for forming the pattern of R1 are aligned over a light-exposing device 30. Then, the light-exposing device 30 illuminates the first mask M1, the first concentration plate 22a, and the R film 23. Accordingly, the light transmitted from the light-exposing device 30 passes through the first mask M1 and the first concentration plate 22a, and illuminates the R film 23 with the appropriate pattern at the appropriate intensity. As a result, the R1 pattern having the 10% concentration of the first concentration plate 22a is formed on the R film 23.

Subsequently, the second mask M2 having the pattern for R2 and the second concentration plate 22b having the R2 concentration of 20% are aligned with the R film 23 that already has the R1 pattern. The light-exposing device 30 illuminates the second mask M2 and concentration plate 22b, thereby forming the R2 pattern having the 20% concentration of the second concentration plate 22b. Finally, the third mask M3 having the pattern for R3 and the third concentration plate 22c having the R3 concentration of 30% are aligned with the R film 23 that already has the R1 and R2 patterns. The light-exposing device 30 illuminates the third mask M3 and concentration plate 22c, thereby completing the R film 23 as shown in FIG. 5A.

Similarly, as shown in FIG. 5B, a Y1 pattern is formed on the Y film 24 to provide the pattern needed for the Y color component of the original copy 20. Furthermore, as shown in FIG. 5C, B1 and B2 patterns are formed on the B film 25 to provide the two patterns needed for the B color component of the original copy 20. Subsequently, an iron or steel alloy plate is prepared for each color by treating each plate with an ammonium type photosensitive liquid. Next, light is projected through each film to illuminate the iron plate or the steel alloy plate, thereby copying the pattern formed on the films 23, 24, and 25 onto plates for reproducing the red, yellow, and blue colors. Thereafter, the plates are inserted in the printing apparatus for transferring red, yellow, and blue ink to an intermediate medium, and ultimately to a final medium that bears the reproduction of the original copy 20.

The conventional technique for forming offset printing films has many disadvantages. For example, many masks and concentration plates are required, including one for each concentration of each color. Therefore, reproducing an original copy often requires many masks and concentration plates. As a result, a large amount of time is consumed to fabricate the masks and concentration plates in order to fabricate films. In addition, when a misalignment of the masks occurs causing a misrepresentation of even a single color concentration of the film, the step of fabricating the printing pattern on the film must be restarted from the beginning.

SUMMARY

The film exposure apparatus and method use a liquid crystal display device to improve film fabrication. In the fabrication apparatus, the liquid crystal display (LCD) may be used as a mask. The LCD may omit color filters and may represent gray scales corresponding to red (R), green (G), and blue (B) color patterns and concentrations that may be determined from a document to be reproduced. A light may illuminate films such as a red color film, a green color film, and a blue color film through the LCD.

A data input unit may supply red (R), green (G), and blue (B) data signals that drive the LCD. The data input unit may be implemented by a computer system. A separate monitor may provide a system operator with a display that shows the current contents of the LCD. For example, the monitor may replicate the gray scale information shown on the LCD.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings.

DETAILED DESCRIPTION

Figure 1:
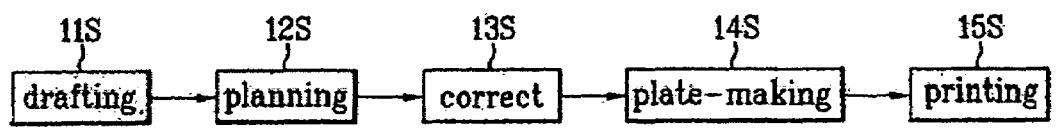
FIG. 1 is a block diagram showing process steps of an offset printing method.
Figure 2:
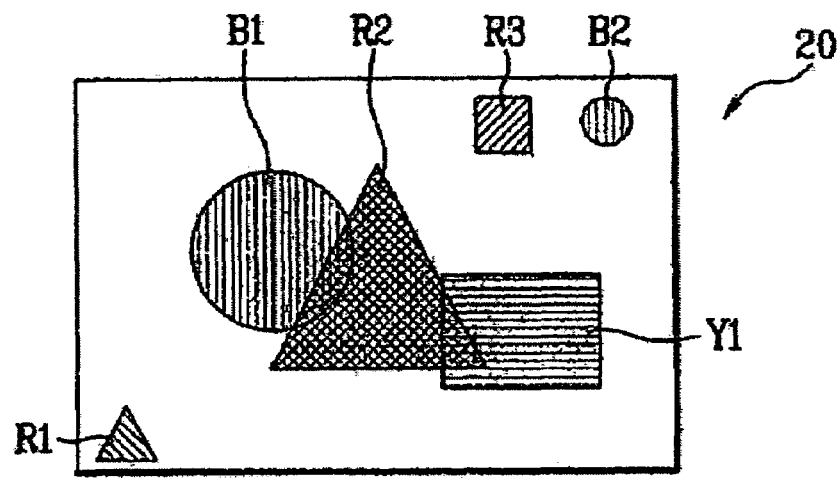
FIG. 2 illustrates an original copy that will be reproduced.
Figure 3A:
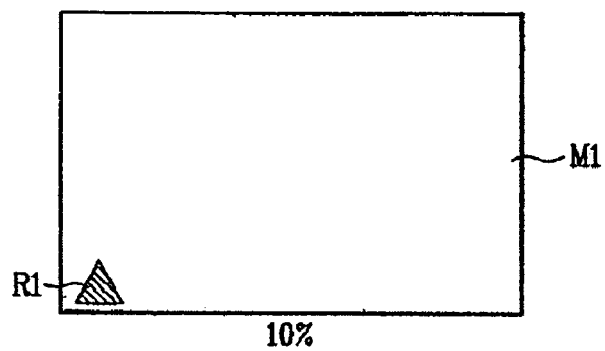
FIGS. 3A to 3C illustrate plan views of masks for each color expressed on the original copy.
Figure 3B:
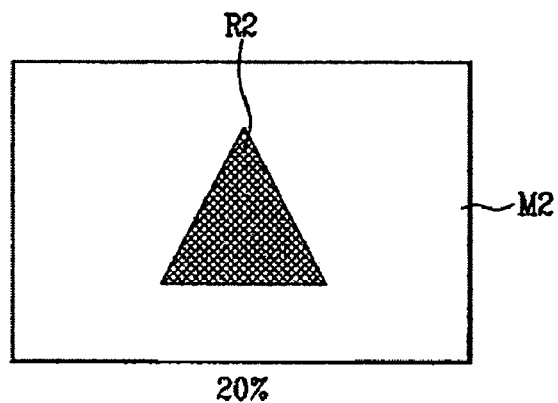
Figure 3C:
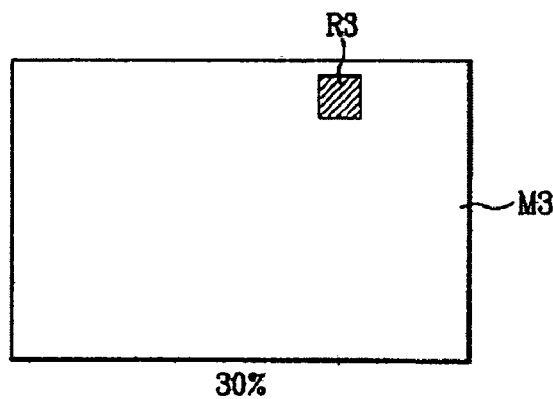
Figure 4:
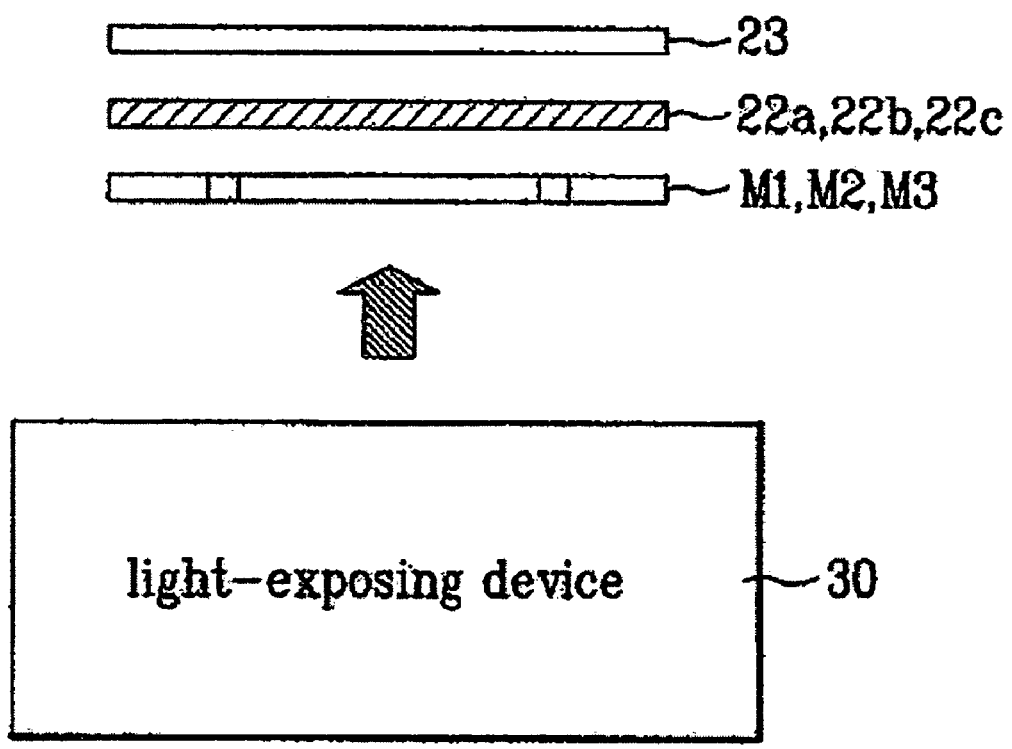
FIG. 4 illustrates process steps for fabricating an offset printing film.
Figure 5A:
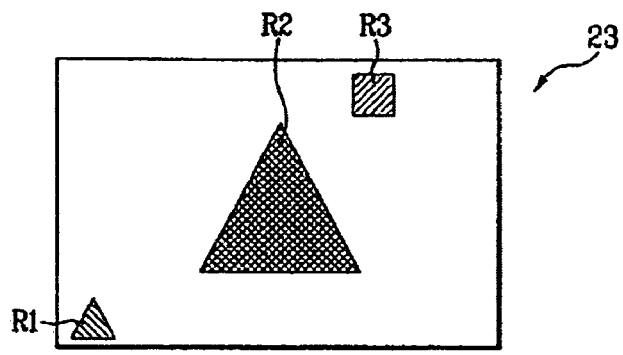
FIGS. 5A to 5C illustrate plan views of R, Y, and B films patterned by using a mask and a concentration plate.
Figure 5B:
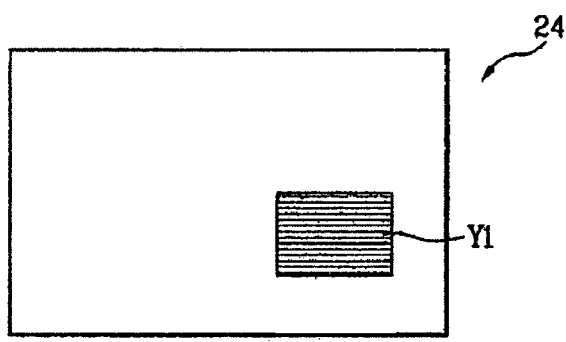
Figure 5C:
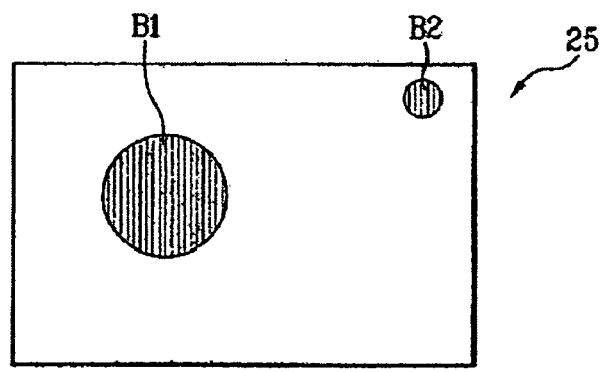
Figure 6:
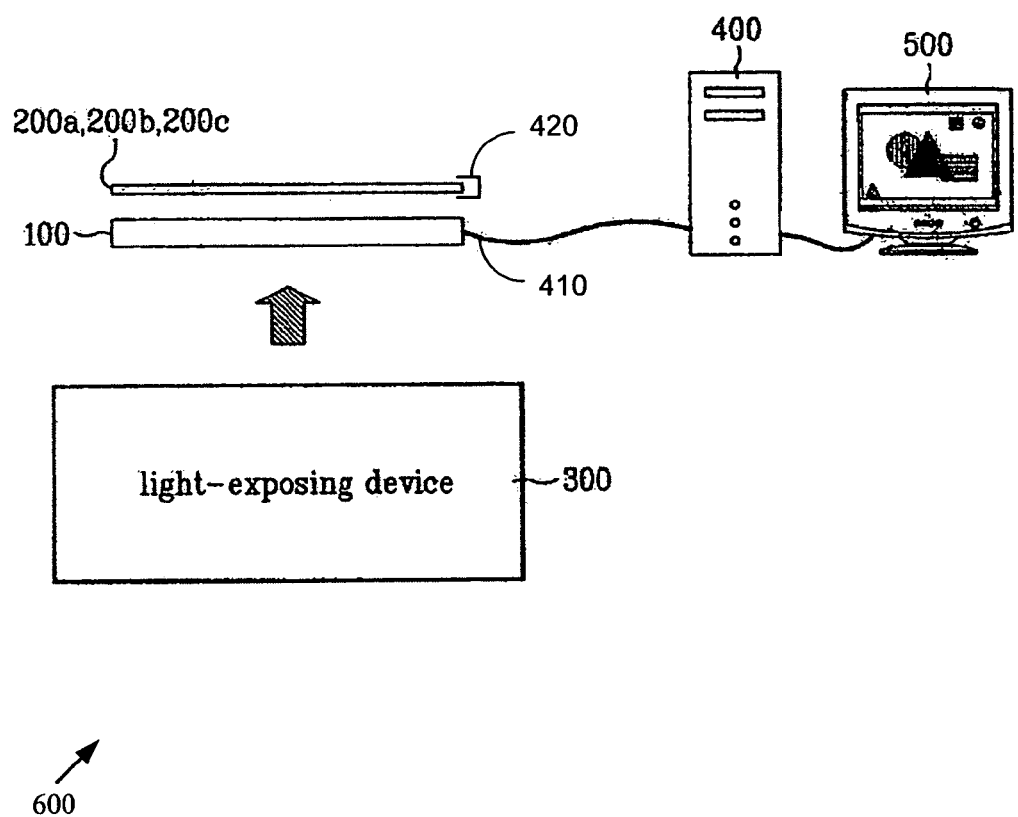
FIG. 6 illustrates an apparatus for preparing films using a liquid crystal display.

FIG. 6 illustrates a film exposure apparatus 600. The apparatus 600 may include a light-exposing device 300, a liquid crystal display (LCD) 100 and a data input unit 400. The data input unit 400 may drive control inputs 410 to the LCD 100. The control inputs 410 may carry color data signals, such as red (R), green (G), and blue (B) data signals that cause the LCD to display an image. The R, G, and B films 200a, 200b, and 200c may be exposed through the LCD and may thereby receive a controlled amount of light having patterns corresponding to the image displayed on the LCD 100.

The data input unit 400 may also include a monitor 500. The monitor 500 may display an image identical to that of the image displayed on the LCD 100. The data input unit 400 may also display, in one or more windows, all or some of the image currently on the LCD 100, may display additional or alternative information, or may display other status information or images. Thus, a system operator may observe the image on the LCD through the monitor 500. The data input unit 400 may be implemented with a computer system or other processing system.

Figure 7:
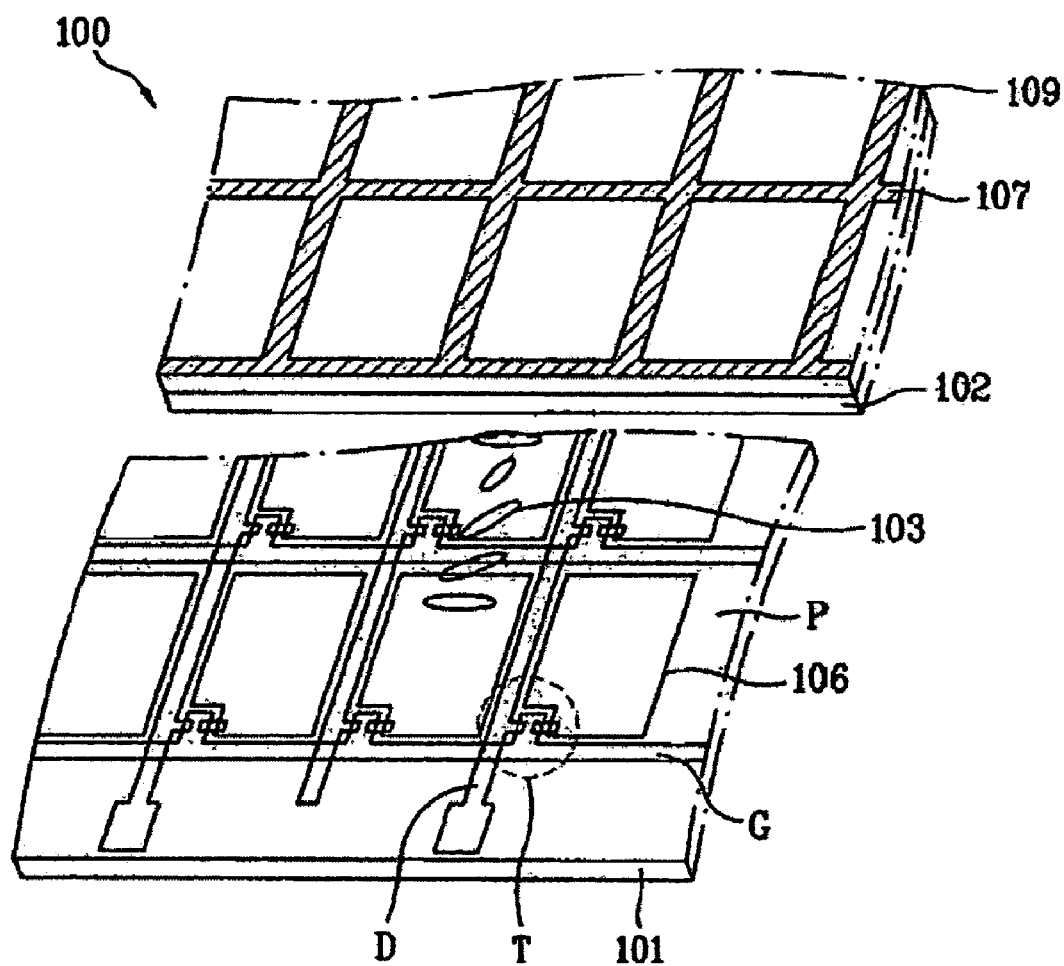
FIG. 7 illustrates the general structure of a liquid crystal display.

FIG. 7 shows that the LCD 100 may include a first substrate 101, a second substrate 109, and a liquid crystal layer 103 injected between the first and second substrates 101 and 109. The first substrate 101 may include multiple gate lines G, data lines D, and pixel electrodes 106 formed in the pixel areas P. The gate lines G may be spaced apart from one another and may be aligned in one direction. The data lines D may be spaced apart from one another and may be aligned in a direction perpendicular to the gate lines G. The pixel areas P may include pixel electrodes 106 formed in a matrix. The pixel areas P may be delineated by the crossing points between each gate line and data line.

The substrate 101 may also include multiple thin film transistors T. The transistors T may be formed at each crossing point between the data lines and gate lines. The signals on the gate lines G may switch the transistors T, thereby communicating the signal from the data lines D to the respective pixel electrode 106. The second substrate 109 may include a black matrix layer 107. The black matrix layer 107 may block light from passing through, while permitting light to pass through the pixel areas P. A common electrode 102 may provide a ground connection.

When the R, G, and B color data signals drive the LCD 100, the data signals reach the pixel electrode 106 through the data lines D. A voltage difference develops between the pixel electrode 106 and the common electrode 102, thereby causing an electric field to be generated between the pixel electrode 106 and the common electrode 102. The liquid crystal molecules of the liquid crystal layer 103 formed between the pixel electrode 106 and the common electrode 102 align to a degree that depends upon the magnitude of the electric field. The degree of alignment influences the amount of light that passes through the liquid crystal 103. By omitting color filters, the LCD 100 may display information corresponding to the color data signals in gray scale by controlling the degree of alignment, and therefore light transmission, of the liquid crystal molecules. The information may correspond to graphics, text, or any other component of a document to be printed.

The LCD 100 may represent colors as a combination of the three primary colors of light: red (R), green (G), and blue (B). The LCD 100 may form an image pattern for the red color components and intensities (the "R image pattern"), an image pattern for the green color components and intensities (the "G image pattern"), and an image pattern for the blue color components and intensities (the "B image pattern"). The image patterns may selectively filter light passing through the LCD 100 according to the color concentrations in the document to be printed.

Figure 8:
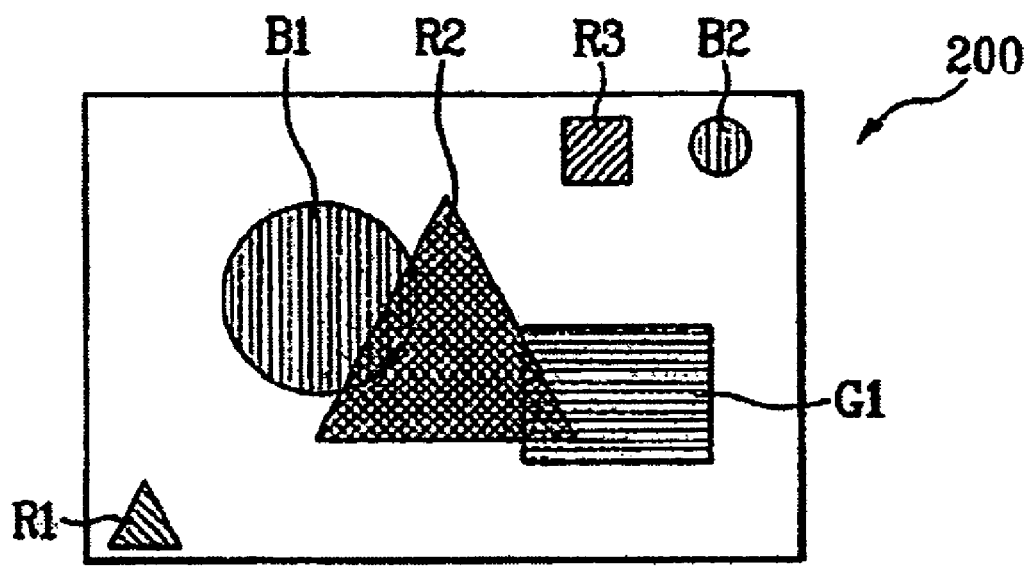
FIG. 8 illustrates an image pattern for each concentration of color forming an image.
Figure 9:
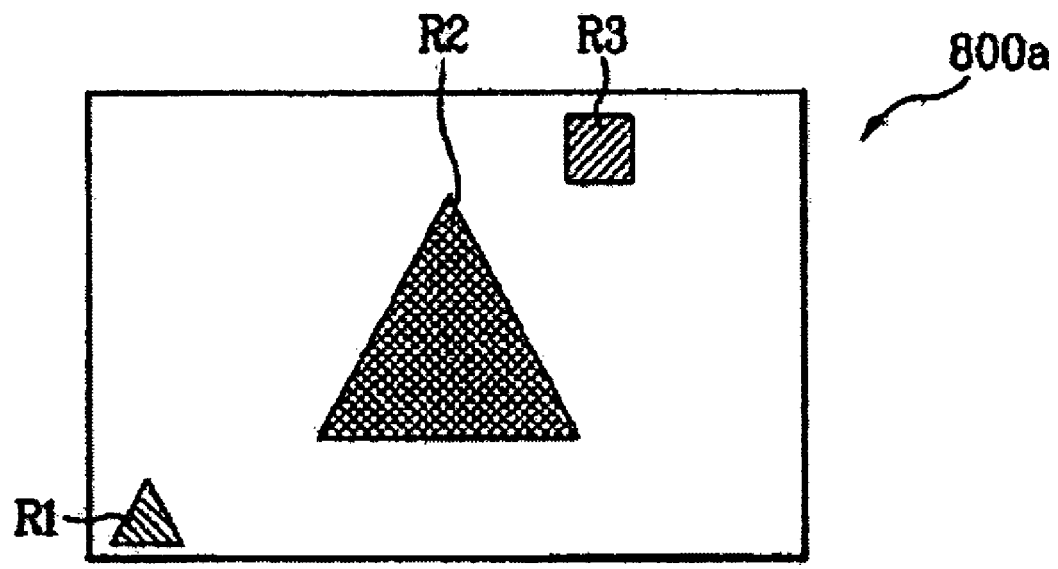
FIG. 9 illustrates a red (R) image pattern
Figure 10:
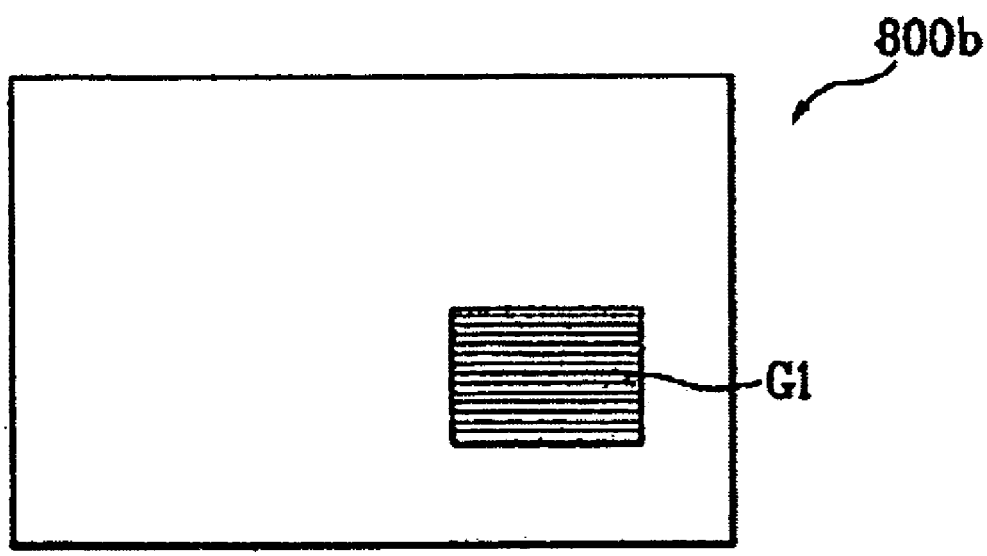
FIG. 10 illustrates a green (G) image pattern.
Figure 11:
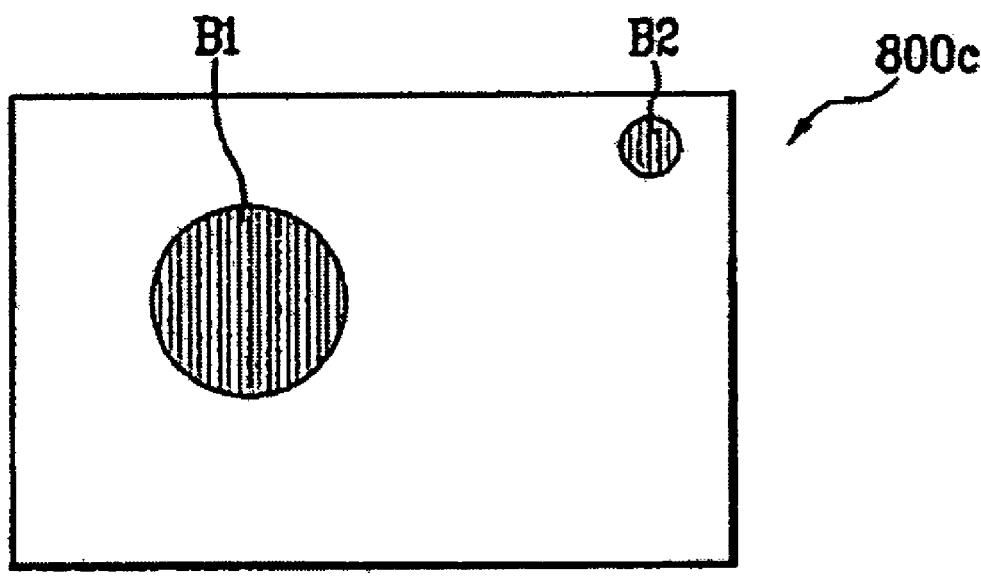
FIG. 11 illustrates a blue (B) image pattern.

FIG. 8 illustrates an image pattern for each concentration of each color in an image 200 of a document to be printed. FIG. 9 illustrates a red (R) image pattern 800a. FIG. 10 illustrates a green (G) image pattern 800b. FIG. 11 illustrates a blue (B) image pattern 800c. As shown, the image 200 may be separated into an R image pattern 800a having three different concentrations R1, R2, and R3, a G image pattern 800b having a single concentration G1, and a B image pattern 800c having two different concentrations B1 and B2.

R, G, and B films 200a, 200b, and 200c for forming the R image pattern 800a, the G image pattern 800b, and the B image pattern 800c, respectively, are prepared. The document to be printed may be pre-stored in the data input unit 400. The data input unit 400 may obtain the document image through a scanning process, a file transfer process, from a machine readable medium such as a compact flash card, or in other manners. Subsequently, the R film 200a is aligned over the LCD 100. A film support 420 may hold the films in place. The film support 420 may be a frame, a cassette, or other support.

The data input unit 400 may simultaneously display image information corresponding to each of the concentrations R1, R2, and R3 of the R image pattern 800a corresponding to the R color intensities on the LCD 100. The image information may act as a light filter. The data input unit 400 may display the R image pattern 800a of the image 200 on the monitor 500 for viewing by the system operator, or for other purposes. The LCD 100 represents the R image pattern 800a of the image 200 in levels of gray.

Subsequently, the light-exposing device 300 illuminates the LCD 100. The LCD 100 controls the intensity of light that emerges from the LCD 100 and that reaches the film. In the case of the image pattern 800a, the light intensity may correspond to each of the concentrations R1, R2, and R3 in the image 200

In other words, the data input unit 400 provides the color data signs to align the liquid crystal layer 103 inside the LCD 100 to represent the R image pattern 800a (and its concentrations). Accordingly, the LCD 100 may act as a mask that selectively transmits or blocks light incident from the light-exposing device 300. The illumination produced by the light-exposing device 300 passes through the LCD 100. The LCD 100 controls the amount of light passing through in accordance with the R image pattern 800a. The light that has passed through the LCD 100 then exposes the film 200a consistent with the R image pattern 800a. As a result, the R image pattern 800a, with each of the three concentrations R1, R2, and R3, is simultaneously formed on the R film 200a.

The LCD 100 permits precise control over the image pattern formed on the LCD 100 as well as the representation of each of the R color concentrations R1, R2, and R3. One benefit is that even very precise or fine image patterns including those that were difficult to represent in prior offset printing techniques, may be precisely transferred to the R film 200a.

The G film 200b is also aligned over the LCD 100. The data input unit 400 displays the G image pattern 800b of the image 200 on the monitor 500. The display unit 400 also outputs the color data signals on the control inputs 410 to display the G image pattern 800b on the LCD 100 in gray scale. When the light-exposing device 300 illuminates the LCD 100, the LCD 100 controls the light intensity to correspond to the concentration G1 of the G image pattern 800b. The controlled amount of light exposes the G film 200b. Accordingly, the G image pattern 800b at the appropriate concentration G1 is formed on the G film 200b.

The B film 200c is also aligned over the LCD 100. The data input unit 400 displays the B image pattern 800c of the image 200 on the monitor 500. The display unit 400 also drives the color data signals on the control inputs 410 to display the B image pattern 800c on the LCD 100 in gray scale. The light-exposing device 300 illuminates the LCD 100. The LCD 100 controls the light intensity according to each concentration B1 and B2 of the B image pattern 800c. The controlled amount of light passes from the LCD 100 to the B film 200c and exposes the B film 200c. Accordingly, the B image pattern 800c corresponding to each of the concentrations B1 and B2 is simultaneously formed on the B film 200c.

The R, G, and B films 200a, 200b, and 200c may be used to develop printing plates. For example, iron or steel alloy plates may be prepared by pouring an ammonium dichromate photosensitive liquid onto the plates. Then, the plates may be illuminated through the corresponding R, G, or B film 200a, 200b, and 200c to transfer an image pattern 800a, 800b, and 800c to a red image plate, a green image plate, or a blue image plate. Subsequently, the plates may be attached to a printing apparatus that mechanically duplicates the original document using the plates.

Figure 12:
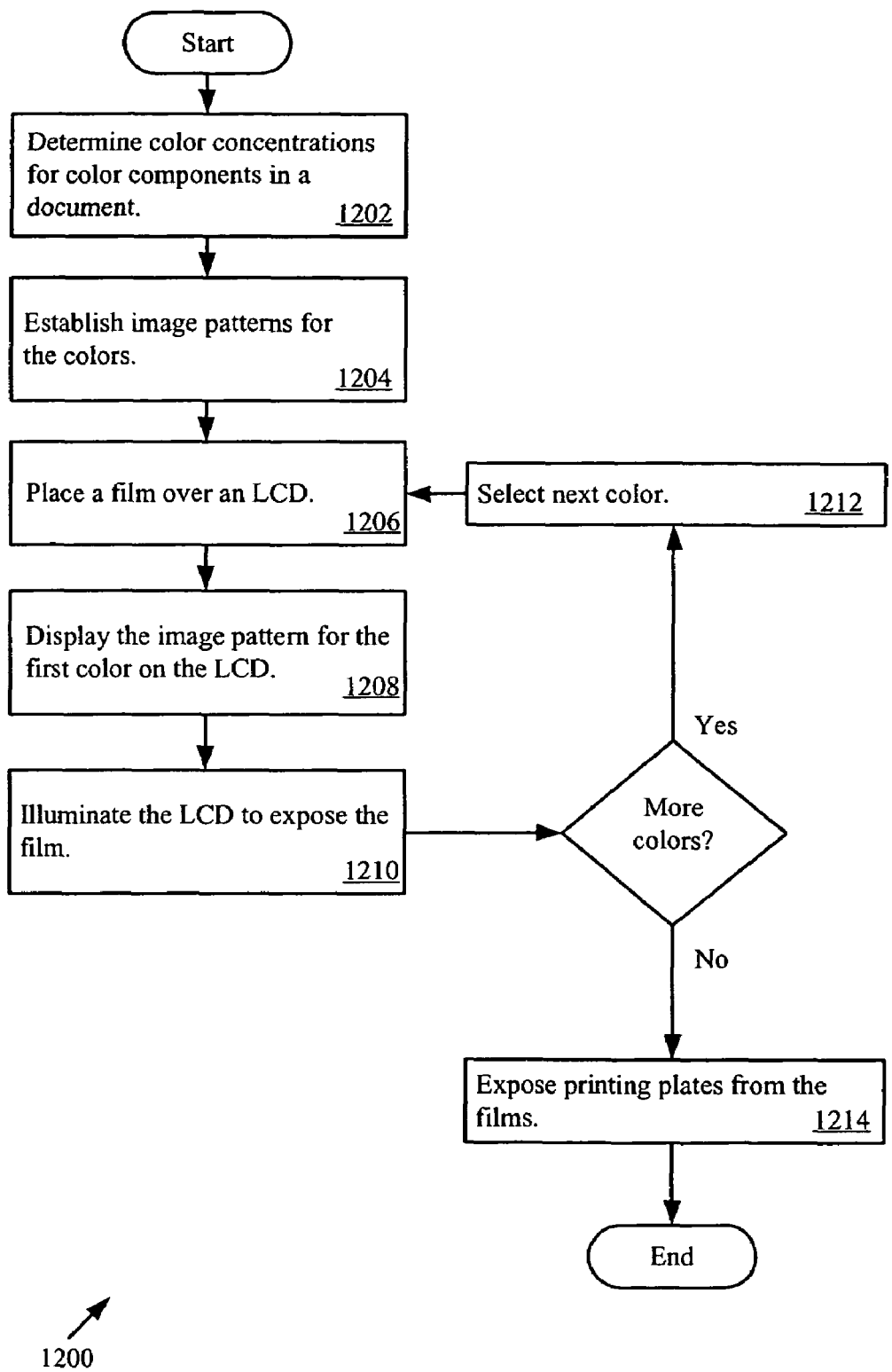
FIG. 12 illustrates a method for exposing an offset printing film.

FIG. 12 shows a process 1200 for exposing films. An original document may be analyzed to determine the colors in the document, and their concentrations (Act 1202). The colors and concentrations may determine image patterns for each color. The image patterns may be established in the data input unit 400 (Act 1204).

A film for a first color may be placed over the LCD 100 (Act 1206). The data input unit 400 may then display the image pattern on the LCD 100 in gray scale (Act 1208). Light may then illuminate the LCD 100 (Act 1210). The LCD 100 controls the light passing through the LCD 100 to expose the film according to the color concentrations in the document. One or more concentrations for a given color may be exposed simultaneously.

If any films remain to be exposed, the next color may be selected (Act 1212) and the next film may be exposed. Any film may be used as the exposure mask for fabricating a printing plates (Act 1214). The printing plates may be used, for example, in an offset printing machine to duplicate the document.

The present apparatus and method have many advantages. First, masks and concentration plates are not needed. As a result, the time and cost required for fabricating the masks and concentration plates may be eliminated. Second, each of the color concentrations for a given color can be formed on the film simultaneously. Accordingly, the time required for fabricating a film may be reduced. Third, the LCD 100 permits very fine and precise image patterns and intensity representations. As a result, quality of the printed product may be greater than the printed product obtained from traditional offset printing.

It will be apparent to those skilled in the art that various modifications and variations can be made in the present invention without departing from the spirit or scope of the inventions. For example, each concentration of each color may be separately shown on the LCD 100 and may be used to form a separate exposure for each concentration. Thus, rather than simultaneously forming the R1, R2, and R3 concentrations on the film, the apparatus may form less than all of the concentrations simultaneously. In addition, the image 200 need not be a color image. Instead, the image 200 may include black and white components and/or grey scale components and/or color components. As another example, while the films may be used to create plates for an offset printing process, the films may be used in connection with other printing process, or for other reasons unrelated to printing. The data input unit 400 may be configured to reproduce image patterns on the LCD 100 in color spaces other than R, G, B, such as RYB, CMY, or CMYK. Thus, it is intended that the present invention covers the modifications and variations of this invention provided they come within the scope of the appended claims and their equivalents.

What is claimed is:

1. A method for fabricating a printing plate using a liquid crystal display comprising:
    obtaining a red (R) film;
    positioning the red (R) film using a film support formed in U shape;
    aligning the red (R) film above a liquid crystal display that omits color filters;
    displaying on the display a red color image pattern in gray scale representing each concentrations of a red color in a document to be reproduced;
    illuminating the red (R) film through the display to expose a light having an amount of light corresponding to each of the concentrations of the red color image pattern onto the red (R) film while displaying the red color image pattern;
    obtaining a green (G) film:
    positioning the green (G) film using the film support formed in U shape;
    aligning the green (G) film above the liquid crystal display that omits color filters;
    displaying on the display a green image pattern representing each concentrations of a green color in the document to be reproduced;
    illuminating the green (G) film through the display to expose a light having an amount of light corresponding to each of the concentrations of the green image pattern onto the green (G) film while displaying the green color image pattern;
    obtaining a blue (B) film:
    positioning the blue (B) film using the film support formed in U shape;
    aligning the blue (B) the display to expose the blue image pattern onto the blue (B) film while displaying the green color image pattern;
    displaying on the display a blue image pattern representing each concentrations of a blue color in the document to be reproduced;
    illuminating the blue (B) film through the display to expose a light having an amount of light corresponding to each of the concentrations of the blue image pattern onto the blue (B) film while displaying the blue color image pattern;
    preparing a first, a second and a third plates to pour an ammonium dichromate photosensitive liquid onto the first, the second and the third plates;
    illuminating the first plate through the red film;
    illuminating the second plate through the green film; and
    illuminating the third plate through the blue film.

2. A method for fabricating a printing plate using a liquid crystal display, comprising:
    displaying on a liquid crystal display that omits color filters a R1 image in gray scale representing a first color concentration of a R document color, a R2 image in gray scale representing a second color concentration of the R document color and R3 image in gray scale representing a third color concentration of the R document color;
    positioning a first film using a film support formed in U shape;
    illuminating the first film through the liquid crystal display while displaying the R1, R2 and R3 images;
    displaying on the liquid crystal display that omits color filters a G1 image in gray scale representing a first color concentration of a G document color;
    positioning a second film using the film support formed in U shape;
    illuminating the second film through the liquid crystal display while displaying the G1 image:
    displaying on the liquid crystal display that omits color filters a B1 image in gray scale representing a first color concentration of a B document color and a B2 image in gray scale representing a second color concentration of the B document color;
    positioning a third film using the film support formed in U shape;
    illuminating the third film through the liquid crystal display while displaying both the B1 image and the B2 image;
    preparing a first, a second and a third plates to pour an ammonium dichromate photosensitive liquid onto the first, the second and the third plates;
    illuminating the first plate through the first film;
    illuminating the second plate through the second film; and
    illuminating the third plate through the third film.

3. The method of claim 2, further comprising receiving liquid crystal display control signals from a data input unit.

4. The method of claim 3, wherein the control signals comprise red, green, and blue data control signals.

* * * * *